United States Patent [19]
Wei et al.

[11] Patent Number: 5,616,524
[45] Date of Patent: Apr. 1, 1997

[54] REPAIR METHOD FOR LOW NOISE METAL LINES IN THIN FILM IMAGER DEVICES

[75] Inventors: Ching Y. Wei, Niskayuna; Jianqiang Liu, Clifton Park; Roger S. Salisbury, Niskayuna; Robert F. Kwasnick, Schenectady; George E. Possin, Niskayuna; Douglas Albagli, Clifotn Park, all of N.Y.

[73] Assignee: General Electric Company, Schenectady, N.Y.

[21] Appl. No.: 580,094

[22] Filed: Dec. 22, 1995

[51] Int. Cl.⁶ .................................. H01L 21/465
[52] U.S. Cl. .................... 438/4; 29/850; 438/98; 438/690; 438/598
[58] Field of Search .................... 437/3, 8, 245, 437/246, 923; 29/850, 847, 853; 324/537; 250/370.09

[56] References Cited

U.S. PATENT DOCUMENTS

| | | | |
|---|---|---|---|
| 4,688,896 | 8/1987 | Castleberry | 350/333 |
| 5,079,070 | 1/1992 | Chalco et al. | 428/209 |
| 5,303,074 | 4/1994 | Salisbury | 359/59 |
| 5,475,246 | 12/1995 | Wei et al. | 257/291 |
| 5,480,812 | 1/1996 | Salisbury | 437/3 |
| 5,518,956 | 5/1996 | Liu et al. | 437/173 |
| 5,543,584 | 8/1996 | Handford et al. | 474/261 |
| 5,552,607 | 9/1996 | Salisbury et al. | 250/370.09 |

OTHER PUBLICATIONS

Application entitled, "Low Noise Address Line Repair Method for Thin Film Imager Devices," filed Dec. 18, 1995, Serial No. 08/574,061.

Application entitled, "Post-Fabrication Repair Structure and Method for Thin Film Imager Devices," filed Jul. 27, 1994, Serial No. 08/280,970.

Primary Examiner—Trung Dang
Attorney, Agent, or Firm—Donald S. Ingraham

[57] ABSTRACT

A method of repairing an open circuit defect in a damaged address line in a thin film electronic imager device includes the steps of forming a repair area on the device so as to expose the open-circuit defect in the damaged address line and then depositing a conductive material to form a second conductive component and to coincidentally form a repair shunt in the repair area so as to electrically bridge the defect. The step of forming the repair area includes the steps of ablating dielectric material disposed over the first conductive component in the repair area, and etching the repair area so as to remove dielectric material disposed over the defect in the address line in the repair area such that the surface of the address line conductive material is exposed but is not contaminated by the removal of the overlying dielectric material. A layer of photoresist is deposited over the imager device prior to forming the repair area, such that the photoresist layer is patterned during the ablating step and serves as a mask during the etch step.

14 Claims, 2 Drawing Sheets

5,616,524

REPAIR METHOD FOR LOW NOISE METAL LINES IN THIN FILM IMAGER DEVICES

This invention was made with Government support under Government Contract No. MDA 972-94-30028 awarded by DARPA. The government has certain rights in this invention.

BACKGROUND OF THE INVENTION

This invention relates generally to thin film electronic imager devices and more particularly to address line structures contained in devices such as solid state radiation imagers having a matrix of electrically conductive address lines for controlling the active components of the device.

Address lines for conducting electrical signals to and from active components in a display or imager device are formed as integral parts of the structure of solid state imagers. These address lines usually form a matrix, with lines running in one direction designated as scan lines and lines disposed in a substantially perpendicular direction designated as data lines. Electrical signals (e.g. the voltage) on a scan line typically control a switching device, such as a field effect transistor (FET, also referred to as a thin film transistor, or TFT), that in turn couples the active component, such as a photosensor, to the data line so that an electrical signal from the photosensor can be read out. A common electrode is disposed over the photosensor array to provide the common contact for each photosensor pixel in the array. The electrical signal that is read out corresponds to the number of detected photons incident on the array, and the signals from the respective photosensors are used to electronically reproduce an image of the photons detected by the array of photosensors.

A defect on a data line can adversely affect overall performance of the thin film imager device. This situation is particularly of concern in imagers in which the data lines have intentionally been severed in the middle of the array in order to reduce noise levels. In this arrangement, it is necessary to be able to read the data lines from each side (or edge) of the array, and an open circuit condition effectively disables all pixels connected to the address line from the point where the open circuit exists to the middle of the array where the data line was intentionally severed. Some degradation of the number of operative pixels can be tolerated with appropriate software changes in the read out circuits, but an imager having sufficient defective address lines may have to be discarded, especially if its intended use is for medical imaging in which minimal line defects are of particular importance in providing high quality imaging.

Given the expense of fabricating thin film electronic imager devices, it is desirable to have devices that are repairable. In particular, it is desirable to have a device that is readily repaired without significant additional processing time during fabrication. It is further desirable that the repair process for data lines that have an open circuit defect be such so as to not significantly increase the amount of electronic noise on the conductive line, which requires that the repair process not cause significant physical damage to the conductive material of the address line repaired, or leave residue on its surface.

SUMMARY OF THE INVENTION

In accordance with this invention a method of repairing an open circuit defect in a damaged first conductive component disposed at a first level in a thin film electronic imager device includes the steps of forming a repair area on the device so as to expose the open-circuit defect in the damaged first conductive component, and depositing a conductive material to form a second conductive component to coincidentally form a repair shunt in the repair area so as to electrically bridge the defect. The step of forming the repair area includes the steps of ablating dielectric material disposed over the first conductive component in the repair area, and etching the repair so as to remove residual dielectric material in the repair area. A layer of photoresist is deposited over the imager device prior to forming said repair area, such that the photoresist layer is patterned during the ablating step and serves as a mask during the etch step.

The step of ablating dielectric material typically involves removing upper layers of dielectric material, such as a layer of polyimide and an underlying layer of silicon nitride ($SiN_x$). The step of etching residual dielectric material includes etching of residual portions of the polyimide and silicon nitride and etching a layer of silicon oxide ($SiO_x$) underlying the silicon nitride so as to expose the conductive material forming the first conductive component. The etch process used to remove the dielectric material disposed over the first conductive component is selective to the first conductive component such that the dielectric material is removed without significant damage to the first conductive component.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
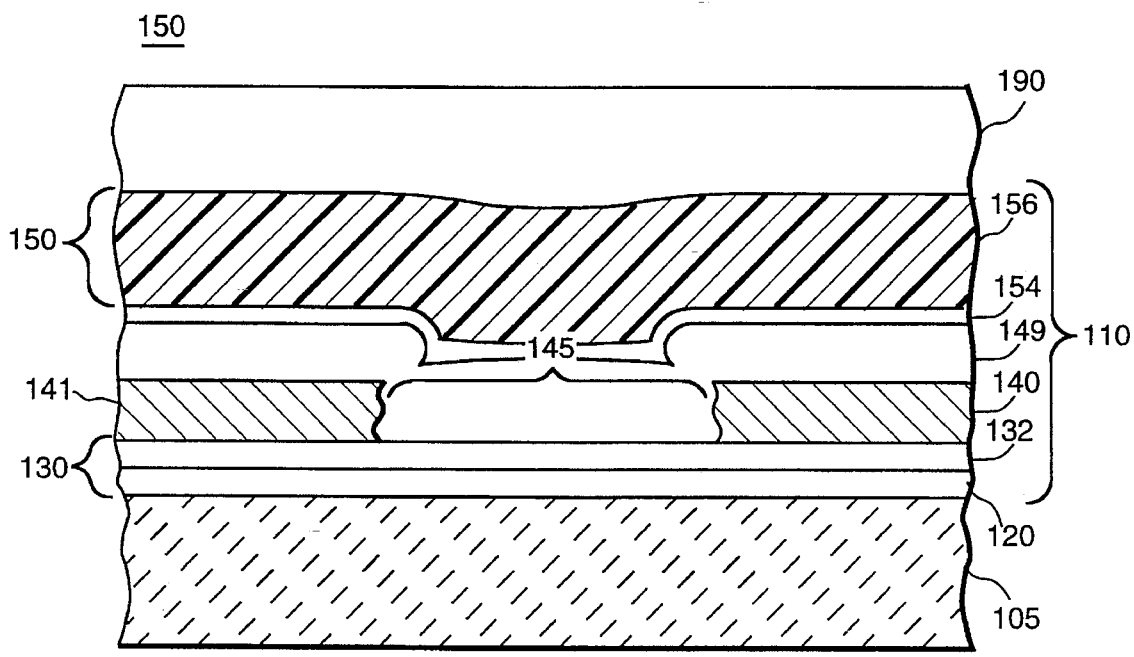
FIG. 1 is a cross-sectional view of an imager device having a defective first conductive component and illustrated at a point in the fabrication process prior to deposition of an overlying second conductive component.

A thin film electronic imager device 100, such as a solid state radiation imager, typically comprises respective layers of conductive, semiconductive, and dielectric material that are disposed on a substrate 105 and that are patterned in the fabrication process to form a photosensor array 110, a portion of which is illustrated in cross-section in FIG. 1 at a point in the fabrication process prior to deposition of a common electrode over the array. Photosensor array 110 comprises a plurality of photosensor pixels (not shown), comprising photodiodes or the like, which are sensitive to incident photons. Each pixel is respectively addressed by a matrix of address lines coupled to the pixels; address lines comprise scan lines (not shown) that are coupled to switching devices to access respective pixels, and data lines that conduct charge collected on the photodiode to readout circuitry. The scan and data lines are electrically insulated from one another by dielectric material disposed between them.

In the fabrication of the photosensor array in a typical imager device, scan lines are formed on substrate 105 (not shown in the cross-sectional portion illustrated in the Figures); a gate dielectric layer 120 (so named as it is disposed over the scan lines with the gate electrodes for the switching transistors formed thereon from overlying components) comprising silicon nitride ($SiN_x$), silicon dioxide ($SiO_x$), or the like, is deposited over the scan line array; a semiconductive layer 132 comprising silicon or the like is deposited over dielectric layer 120. Semiconductive layer 132 may further comprise a doped semiconductive layer (not shown) comprising silicon doped to exhibit n type conductivity or the like is deposited over the semiconductive silicon. Semiconductive layer 132 is patterned to form the bodies of switching devices (not shown), such as a field effect transistor (FET) (also referred to as a thin film transistor (TFT)) associated with each pixel. The combined layers of semiconductive layer 132 (with the doped semiconductive layer thereon) and underlying dielectric material layer 120 are typically referred to collectively as a FET sandwich 130. Conductive material, such as molybdenum, titanium, aluminum, chromium, or the like, is deposited and patterned to form source and drain electrodes (not shown) for each TFT and this layer of conductive material is also patterned to form data lines 140 (a representative one of which is shown in cross section in FIG. 1) in the array.

Following formation of the FETs, a FET passivation layer 149 is deposited over the array. FET passivation layer 149 typically comprises an inorganic dielectric material such as silicon oxide or the like and typically has a thickness in the range between about 0.2 μm and 1 μm.

Additional fabrication steps include the formation of the photodiodes, including the deposition and patterning of semiconductive material, typically silicon, to form the photodiode body (not shown in the cross-sectional portion of the imager illustrated in FIG. 1). A photosensor barrier layer 150 is then formed over the array; barrier layer 150 typically comprises a first protective layer 154 comprising an inorganic dielectric material such as silicon nitride ($SiN_x$) or the like. In the portion of the array illustrated in cross section in FIG. 1, first protective layer 154 is disposed over FET passivation layer 149. First protective layer 154 of silicon nitride typically has a thickness in the range between about 0.04 μm and 0.5 μm. A second protective layer 156 comprising an organic dielectric material such as polyimide or the like is disposed over first protective layer 156 and FET passivation layer 149. Second protective layer 156 typically has a thickness in the range between about 0.5 μm and 2.5 μm.

After formation of barrier layer 150, fabrication of photosensor array 110 is continued with the deposition and patterning of a common electrode (not illustrated in FIG. 1) disposed over barrier layer 150 and in electrical contact with a portion of each photosensor body through vias (not shown) opened in the barrier layer. A scintillator material (not shown) is then deposited over the common electrode to complete the array.

FIG. 1 illustrates an imager device at a first stage in the repair process of the present invention; at this point in the fabrication process, the FETs have been formed and FET passivation layer 149 and barrier layer 150 have been deposited. At this stage the electrical integrity of the address lines can be tested; for purposes of illustrating the process of this invention, a defect 145 is shown disposed in data line 140 such that an open circuit condition exists between a first portion 141 and a second portion 142 of data line 140. Defect 145 comprises a break in the conductive material of data line 140 in which non-conductive material is disposed between respective portions 141, 142, of the data line. The non-conductive material typically comprises dielectric material from FET passivation layer 149, but further may comprise other non-conductive material that have been used in the array fabrication process. As used herein, "non-conductive" refers to both dielectric and semiconductive material that may be disposed in defect 145 so as to create the open circuit condition (the term also implies a non-gaseous material, such as solid or fluid that reposes in the defect region). Defect 145 results from damaged or missing metal for data line 140 such as might occur when there is a defect in the mask used for the deposition or patterning of the conductive material comprising data line 140, or from damage to the conductive line in processing. Alternatively, the defect may have been made with a laser, such as in an attempt to cut the line in order to isolate a portion of data line 140 shorted to an underlying conductive component, e.g., a scan line, such as at a crossover point between the two types of address lines. The open circuit condition of the data line is typically determined and recorded during inspection of the imager device following formation of the data lines.

In accordance with this invention, prior to removal of portions of barrier layer 150 to expose defect 145 in address line 140, a layer of photoresist 190 is deposited in a spin process, a meniscus process, or the like, over the organic dielectric material comprising second protective layer 156 across the array. Photoresist layer 190 typically has a thickness in the range between about 1 μm and 3 μm.

In accordance with the present invention, the open-circuit defect 145 in data line 140 is repaired with the use of a procedure that opens a repair area 160 (FIG. 2) around defect 145 that exposes address line 140 while maintaining the low noise characteristics of the address line. In particular, the process of exposing the conductive material comprising the component being repaired, e.g., address line 140, is such that the conductive material is not contaminated. As used herein, "not contaminated, "uncontaminated" or the like refers to the conductive component to be repaired being fully exposed (that is, about 90% or more of the surface conductive component in repair area 145 is exposed with few, if any, residual materials from other components in the device are left on the surface of the conductive component in the repair area); and the condition of the conductive component (data line 140) is substantially the same as it was when the data line was formed (that is, after deposition of the conductive material, patterning, and cleaning of the surface to complete the formation process of the conductive component during the fabrication process, which typically does not damage the conductive material but may result in some oxidation of the conductive material on the surface of the address line). The address line being in substantially the same condition further implies that the line is substantially geometrically the same shape as when formed, with the surface of the conductive material being relatively smooth without notches, depressions, or the like. One manifestation of the process of the present invention providing an uncontaminated address line 140 in the repair area is that, when repaired, the address line exhibits noise characteristics that are typically not greater than about 10% more noise than an undamaged and unrepaired address line. Such noise measurements are typically obtained by reading out the imager in the dark and calculating the standard deviation of each pixel from a set of the dark images.

Following the formation of repair area 160 such that uncontaminated portions of address line 140 are exposed around defect 145, as described further below, conductive material is deposited to form a second conductive component 170 (FIG. 4) on a succeeding level of the device. As used herein, "succeeding level of the device" refers to a conductive component that is formed in the fabrication process following the formation of address line 140, and thus is typically disposed on a different level of the sandwich of materials that are deposited to fabricate the components for the imager device. No restriction on the orientation of the device is to be implied by the terminology relating to levels of the components. As set out above, in the repair of a data line in an imager, the next conductive component to be deposited in the fabrication process is typically the common electrode of the photosensor array.

Figure 2:
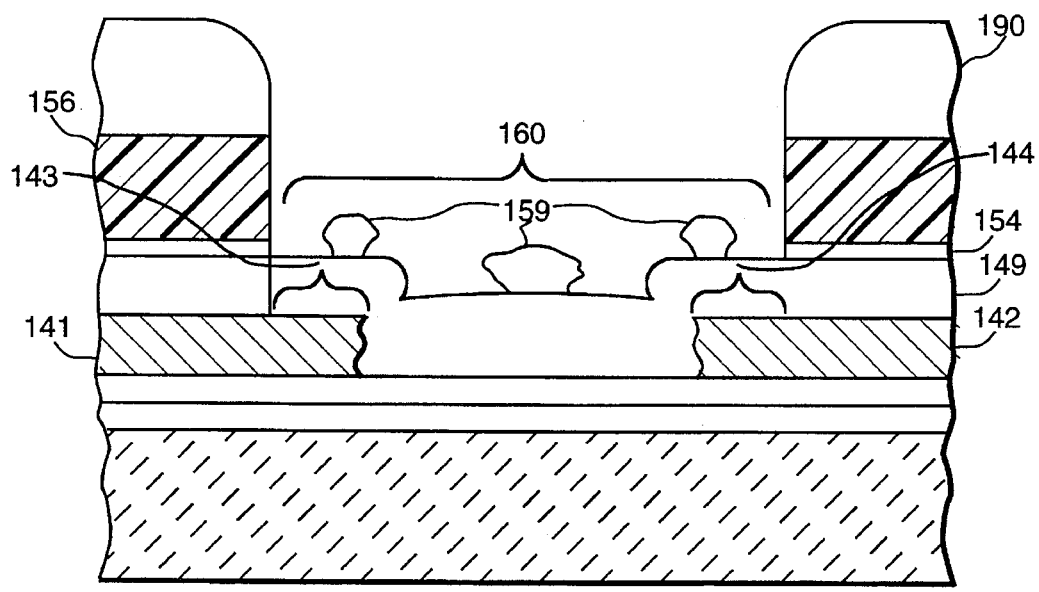
FIG. 2 is a cross-sectional view of an imager device in which ablation has been used to begin the formation of a repair area over the defect in the first conductive component in accordance with the present invention.

Repair area 160 (FIG. 2) is formed by removing portions of photoresist layer 190 and underlying portions of protective layer 150 to expose defect 145 and selected adjoining portions of data line 140. Typically laser ablation is used to remove the portions of photoresist layer 190, second protective layer 156, and first protective layer 154 from selected repair area 160. In particular, a xenon-chloride type excimer laser provides a finely-focused beam (e.g., in the range between about 1 $\mu m^2$ to 20 $\mu m^2$) that is very effective in ablating the above-mentioned non-conductive material with the ability to maintain precise boundaries around repair area 160. Laser ablation is not, however, as effective in removing FET passivation layer 154 as that layer comprises silicon oxide, which exhibits poor energy absorption in the visible and near ultraviolet (UV) wavelength range. It has been found that the poor energy absorption of the silicon oxide requires lengthy efforts at ablation to remove the material, and typically such an ablation efforts results in a contaminated surface of first conductive component 140 underlying the silicon oxide ablated. Thus, in accordance with this invention, laser ablation is stopped following removal of photoresist layer 190, the organic dielectric of second protective layer 156, and the silicon nitride of first protective layer 154 in repair region 160. Typically the ablation process results in some residual particles 159 remaining from portions of FET passivation layer 150 ablated away remaining in repair area 160, as illustrated in FIG. 2.

For example, in a typical imager device structure in which address line 140 comprises molybdenum having a thickness in the range between about 0.2 µm and 1 µm (and typically about 0.4 µm), FET passivation layer 149 comprises silicon dioxide having a thickness of about 0.5 µm, and first protective layer 154 comprises silicon nitride having a thickness of about 0.1 µm, and second protective layer 156 comprises polyimide having a thickness of about 1.4 µm, a Florod, Inc., brand Model LCM 308 excimer laser has been used at about 7% power (total power being about 350 microjoules) to ablate non-conductive material to form selected repair area 160 having dimensions of about 10 µm by 40 µm (on the surface of the array).

Figure 3:
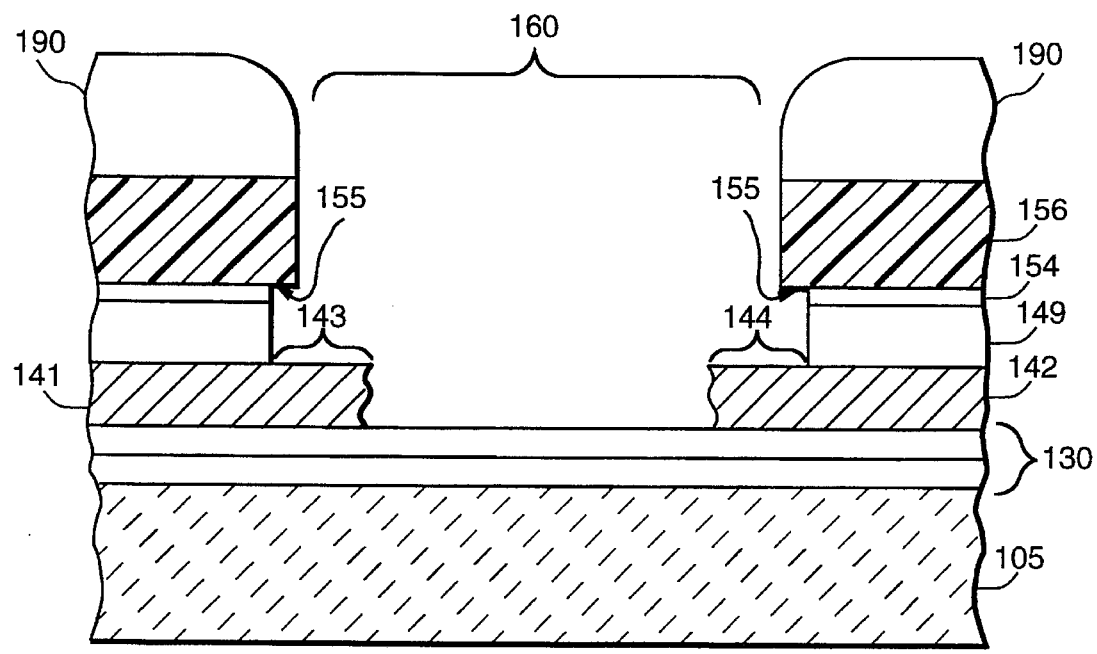
FIG. 3 is a cross-sectional view of an imager device in which the repair areas has been formed over the defect in the first conductive component following an etching step in accordance with the present invention.

In accordance with this invention, formation of repair area 160 is then completed by etching the residual dielectric material in repair area 160 so as to remove residual dielectric material in the repair area to expose defect 145 and adjoining portions of address line 140, as illustrated in FIG. 3, the etching step further providing that the exposed surfaces of the address line 140 remain uncontaminated. The adjoining portions of data line 140 include a first segment 143 of first address line portion 141 and a second segment 144 of second address line portion 142 of address line 140, the adjoining portions collectively comprising areas on each portion of the data line adjoining by open circuit defect 145. Segments 143 and 144 are sufficiently large to allow the subsequently deposited conductive material to make satisfactory electrical contact to data line 140 and to form a stable structure. In a typical imager in which address line 140 has a width of about 7 µm, segments 143 and 144 each have a length of about 10 µm. Additionally, the sidewalls of photoresist layer 190 and the portion of barrier layer 150 where the non-conductive material has been ablated are typically also substantially smooth surfaces that are disposed substantially vertically between the lower surface of selected repair area 160 exposed by the ablation and the upper surface of barrier layer 150).

In one embodiment of the present invention, the etching step comprises wet etching the repair area with an etch ant selective to the dielectric material disposed in repair area 160. For example, a hydrofluoric acid-based etchant, such as buffered hydrofluoric acid (BHF) etchant or the like that does not attach the conductive material) is effective in the removal of residual particles 159 that comprise silicon nitride of first protective layer 152, and thus also lifting off any residual portions of the polyimide of second protective layer 156, and further effectively removes the silicon oxide comprising FET passivation layer 149. For this etching step, photoresist layer 190 and polyimide second protective layer 156 serve as a mask such that only the dielectric material in repair area 160 is exposed to the etchant. The selective nature of the etchant (e.g., BHF) results in removal of the inorganic (and lifting off of the organic) dielectric material remaining in repair area 160 following the ablation step without attacking the conductive material comprising address line 140; the etching results in exposing defect 145 and adjoining segments 143 and 144 of address line 140 without causing contamination to the surface of the address line conductive material. The wet etchant is further selected such that it does not significantly etch the silicon or n+ doped silicon of semiconductive layer 132. At the conclusion of the wet etching step, repair area 160 of array 100 appears as is illustrated in FIG. 3. As is seen in FIG. 3, residual particles 159 have been etched away, as has been the portions of FET passivation layer 149 exposed in the repair area under the opening in the mask formed by photoresist layer 190. Given the nature of the wet etch, a small undercut region 155 is formed under second protective layer 156 due to the etching along the sidewall of the silicon nitride of first protective layer 154 and the silicon oxide of FET passivation layer 149.

In an alternative embodiment of the present invention, the etching step to expose defect 145 and adjoining segments of address line 140 comprises a reactive ion etch (RIE). Such an etching process uses $CHF_3$/Ar or the like that is selective to the conductive metal, while being an effective etchant for the organic and inorganic materials necessary to be removed in order to expose the repair area.

Following the etching step, photoresist layer 190 is removed in accordance with procedures commonly used in the art. The exposed second protective layer 156 (comprising polyimide) is then patterned, for example, to form via contact channels (not shown) to the photosensors in the array.

Figure 4:
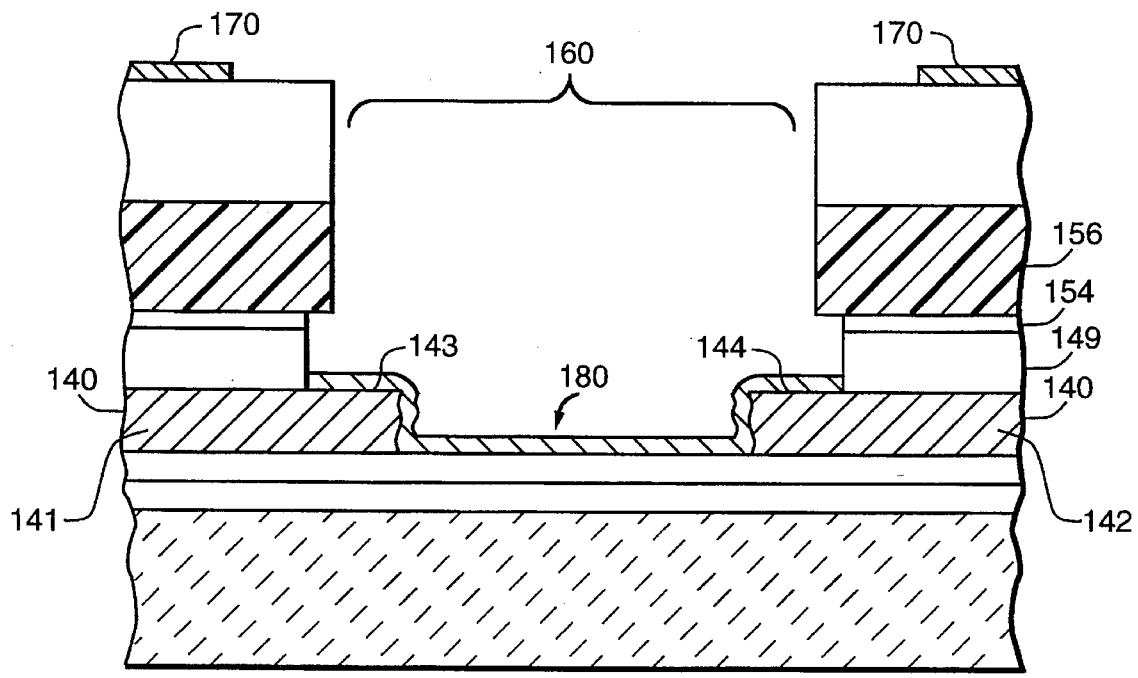
FIG. 4 is a cross-sectional view of an imager device after deposition of the repair shunt and second conductive component in accordance with the present invention.

Next, the conductive material to form a second conductive component 170 on a succeeding level of the device is deposited. For example, common electrode 170 (FIG. 4) is formed in imager device 100 by depositing a conductive material (for imager devices, this material is deposited to form a substantially optically transparent layer) such as indium tin oxide, or the like, using, for example, a sputter process. Alternatively, conductive materials such as aluminum, chromium, or the like can be used to form the common electrode; if such non-optically transparent material is used, however, additional process steps are required to pattern the common electrode so that it does not prevent light from reaching large portions of the photodiode surface. Coincidentally with the deposition of common electrode 170, a repair shunt 180 is formed in selected repair area 160 as the same conductive material that is used to form common electrode 170 is deposited over defect 145 and on segments 143 and 144 of data line 140. As illustrated in FIG. 4, repair shunt 180 thus comprises the same conductive material as common electrode 170 and is disposed so as to electrically bridge defect 145 such that first portion 141 and second portion 142 of data line 140 are electrically coupled together. Similarly, the thickness of repair shunt 180 corresponds with the thickness of common electrode 170 as the two components are formed in the same deposition process. Alternatively, dependent on the component being repaired, the conductive material deposited to form the repair shunt may be the same as the conductive material of the underlying component in which the defect exists.

As illustrated in FIG. 4, repair shunt 180 extends over all surfaces of address line 140 that are exposed in repair area 160, which coverage is desirable from the standpoint of structural integrity when using a conductive material such as indium tin oxide or the like. Alternatively, repair shunt 180 can be disposed in-between first portion 141 and second portion 142 of data line 140 in lieu of being disposed on the upper surfaces of segments 143 and 144, so long as adequate electrical contact is made to bridge the open circuit between first and second data line portions 141, 142.

Following formation of repair shunt 180, any conductive material coupling repair shunt 180 to common electrode 170 is removed so as to electrically isolate repair shunt 180 from common electrode 170. Removal of such conductive material (as may be adhering to sidewalls of barrier layer 150 in selected repair area 160) is typically accomplished with laser ablation, particularly with the use of an excimer laser as set out above. For example, portions of common electrode 170 extending around the edge of second protective layer 156 are removed to leave a gap between the common electrode and the repair area in the range between about 2 μm and 30 μm.

Following completion of the repair, that is the formation of repair shunt 180 and electrically isolating the repair shunt from common electrode 170, a barrier layer (not shown) comprising, for example, silicon nitride, silicon dioxide, or the like, is deposited over common electrode 170, repair shunt 180, and the exposed sidewalls of protective layer 150 in selected repair area 160.

The procedure of this invention thus enables data lines to be readily repaired during the fabrication process of an imager device with a procedure that significantly improves the yield for making an effective repair as compared to repair regimes in which only laser ablation is used. For example, the etching step can be used effectively to proceed with repairs at any number of repair areas 160 on the array 100 that have been prepared. The etching step not only saves time by providing a "batch" processing of the repair areas, but is more effective in producing satisfactory repairs (from the standpoint of repaired lines meeting noise standards) than using a laser to drill through the silicon oxide dielectric material at each repair area. For example, laser-only repair methods often provided only about a 25% yield, whereas the process of the present invention improves the yield to nearly 100%. The process thus is readily adapted for repair of multiple defects in a particular line and repair of multiple damaged data lines.

The process of the present invention further provides a relatively low resistance and low noise repair shunt structure of the transparent conductive oxide material (e.g., providing a shunt with a resistance in the range of 100 Ω to 500 Ω) that are appropriate for repair of address lines in imager arrays in which low resistance on address lines is critical for maintaining low noise operation of the imager device. The etching process that provides the exposure of uncontaminated address line segments in the repair area further provides lower noise repair structures as compared to repairs effected using only laser ablation techniques. For example, it has been observed that laser ablation-only repair techniques result in a repaired address line having a noise level that is in the range between about 0% and 300% greater than an similar address line that is undamaged; by contrast, the repair method of the present invention results in a repaired address line having a noise level that is in the range of between about 0% and 10% greater than that of a similar address line that has not been repaired. This noise reduction is very significant, especially in medical imagers used for fluoroscopy, in which reduced noise is critical for real time read out of high resolution imaging data.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of repairing an open circuit defect in a damaged first conductive component disposed at a first level in a thin film electronic imager device with at least one dielectric material disposed over said defect, the method comprising the steps of:

forming a repair area on said device, said repair area being disposed so as to expose said open-circuit defect in said damaged first conductive component and selected adjoining portions of said first conductive component; and depositing a conductive material to form a second conductive component and to coincidentally form a repair shunt in said selected repair area disposed in electrical contact with said damaged first conductive component so as to electrically bridge said defect in said damaged first conductive component;

the step of forming said repair area comprising the steps of 1) ablating a portion of the dielectric material disposed over said first conductive component in said repair area, and 2) etching said repair area so as to remove remaining dielectric material in said repair area and to expose said first conductive component in said repair area, the exposed surfaces of said first conductive component being uncontaminated.

2. The method of claim 1 wherein the step of forming said selected repair area further comprises the step of depositing a layer of photoresist material over said thin film electronic device and patterning said photoresist material in said repair area simultaneously with ablating said dielectric material disposed over said repair area.

3. The method of claim 2 wherein the step of etching said repair area comprises applying an etchant selective to said dielectric material disposed over said first conductive component so as to expose uncontaminated surfaces of said first conductive component.

4. The method of claim 3 wherein a plurality of protective layers are disposed over said first conductive component, said plurality of protective layers respectively comprising inorganic dielectric materials and organic dielectric materials as follows:

a FET passivation layer disposed in contact with said first conductive component, said FET passivation layer comprising silicon oxide ($SiO_x$);

a first protective layer disposed over said FET passivation layer and comprising silicon nitride ($SiN_x$); and a second protective layer disposed over said first protective layer and comprising polyimide.

5. The method of claim 4 wherein the step of ablating dielectric material disposed over said repair area comprises ablating portions of said first and second protective layers disposed in said repair area.

6. The method of claim 5 wherein the step of etching said repair area comprises etching said FET passivation layer disposed in said repair area and residual portions of said first and second protective layers remaining in said repair area.

7. The method of claim 6 wherein the step of etching said repair area comprises an etching process selected from the group of wet etching said repair area with said etchant selective to said first conductive component and reactive ion etching said dielectric material disposed in said repair area; the step of wet etching comprising use of an etchant comprising buffered hydrofluoric acid such that said photoresist layer is a mask for said etchant.

8. The method of claim 7 wherein the step of etching said repair area to expose said first conductive component comprises the step of removing dielectric material disposed in-between portions of said first conductive component adjoining said defect.

9. The method of claim 3 further comprising the step of removing said photoresist layer and patterning the dielectric material underlying said photoresist layer.

10. The method of claim 1 further comprising the step of removing conductive material disposed between said second conductive component and said repair shunt so as to electrically isolate said first conductive component and said second conductive component in said repair area.

11. The method of claim 1 wherein said first conductive component comprises an address line.

12. The method of claim 11 wherein said address line comprises a material selected from the group consisting of molybdenum, titanium, aluminum and chromium.

13. The method of claim 1 wherein said second conductive component comprises a common electrode disposed over said imager device.

14. The method of claim 13 wherein said common electrode comprises a material selected from the group comprising indium tin oxide, aluminum, and chromium.

* * * * *